(12) United States Patent
Watanabe et al.

(10) Patent No.: US 8,366,478 B2
(45) Date of Patent: Feb. 5, 2013

(54) ELECTRONIC DEVICE

(75) Inventors: Toshiyuki Watanabe, Gifu (JP); Tatuo Hoshiba, Osaka (JP)

(73) Assignee: SANYO Electric Co., Ltd., Moriguchi-shi, Osaka (JP)

( * ) Notice: Subject to any disclaimer, the term of this patent is extended or adjusted under 35 U.S.C. 154(b) by 0 days.

(21) Appl. No.: 12/730,794

(22) Filed: Mar. 24, 2010

(65) Prior Publication Data

US 2010/0248531 A1 Sep. 30, 2010

(30) Foreign Application Priority Data

Mar. 30, 2009 (JP) ................................. 2009-081172

(51) Int. Cl.
*H01R 11/00* (2006.01)
(52) U.S. Cl. ........................................ 439/502; 439/498
(58) Field of Classification Search .................. 439/502, 439/505, 494, 498
See application file for complete search history.

(56) References Cited

U.S. PATENT DOCUMENTS

| | | | | |
|---|---|---|---|---|
| 4,065,199 | A * | 12/1977 | Andre et al. | 439/498 |
| 6,554,639 | B2 * | 4/2003 | Doriski, Jr. | 439/498 |
| 6,702,607 | B2 * | 3/2004 | Kondo | 439/498 |
| 7,199,487 | B2 * | 4/2007 | Hayes | 307/10.1 |
| 2001/0019919 | A1 * | 9/2001 | Mochizuki et al. | 439/494 |
| 2003/0036305 | A1 * | 2/2003 | Noguchi | 439/502 |

FOREIGN PATENT DOCUMENTS

JP 2002-078167 A 3/2002

* cited by examiner

*Primary Examiner* — Tulsidas C Patel
*Assistant Examiner* — Travis Chambers
(74) *Attorney, Agent, or Firm* — Westerman, Hattori, Daniels & Adrian, LLP

(57) ABSTRACT

In the electronic device according to the present invention, a plurality of electronic components are connected to respective terminal blocks through respective signal cables, the signal cables each includes an end connected to a terminal of each of the electronic components, a connector attached to the other end of each of the signal cables is connected to each of the terminal blocks. the plurality of signal cables are bundled together at a deflection position distances to which from the terminals of the plurality of electronic components are different, the plurality of signal cables extend from the deflection position to corresponding terminal blocks, and the positions of the plurality of terminal blocks are shifted from each other in accordance with difference in lengths of the signal cables from the deflection position passing point to the connectors.

7 Claims, 3 Drawing Sheets

ELECTRONIC DEVICE

The application Number 2009-81172, upon which this patent application is based, is hereby incorporated by reference.

BACKGROUND OF THE INVENTION

1. Field of the Invention

The present invention relates to an electronic device in which a plurality of electronic components are connected to respective terminals through respective signal cables.

2. Description of Related Art

In a video camera, for example, a housing 1 including an objective lens 11 is provided, on its side, with a display device 2 arranged openably and closably via a hinge mechanism 20 as shown in FIG. 5. In the housing 1, arranged is a right and left pair of microphones 3, 4 which are connected to a right and left pair of terminal blocks 6, 7 on a circuit board through respective signal cables (not shown), to thereby enable voice stereo recording.

In particular, as shown in FIG. 3, a signal cable 32 is drawn out from a terminal 31 of the right channel microphone 3, and a signal cable 42 is drawn out from a terminal 41 of the left channel microphone 4. Connectors 33, 43 are attached to tip end parts of the respective signal cables 32, 42. The signal cables 32, 42 each comprises two lead wires which are bundled together.

As shown in FIG. 4, the signal cable 32 drawn out from the right channel microphone 3 passes between the microphones 3, 4 and extends to the circuit board 5 side. The connector 33 at the tip end part of the signal cable 32 is coupled to the right channel terminal block 6 on the circuit board 5.

Also, the signal cable 42 drawn out from the left channel microphone 4 passes between the microphones 3, 4 and extends to the circuit board 5 side. The connector 43 at the tip end part of the signal cable 42 is coupled to the left channel terminal block 7 on the circuit board 5.

In an assembly process of such a camera as described above, in a work on coupling the two connectors 33, 43 to the corresponding terminal blocks 6, 7 as shown in FIG. 4, it is required that the connector 33 which is connected to the right channel microphone 3 should be coupled to the right channel terminal block 6, and that the connector 43 which is connected to the left channel microphone 4 should be coupled to the left channel terminal block 7.

However, for component standardization, as shown in FIG. 3, the signal cable 32 drawn out from the right channel microphone 3 and the signal cable 42 drawn out from the left channel microphone 4 have the same lengths, and the connectors 33, 43 have the same specifications and shapes. Therefore, mistakenly, the connector 33 connected to the right channel microphone 3 might possibly be coupled to the left channel terminal block 7 and the connector 43 connected to the left channel microphone 4 might possibly be coupled to the right channel terminal block 6.

Therefore, there has been a technique proposed for enabling differentiation between the two connectors by, in the case of using a flat harness as the signal cable, bending one of two flat harnesses having the same lengths at a part in a length direction to shorten the length, thereby making the lengths different from each other.

However, in the technique described above, required is a work of bending a specific one flat harness as a preliminary step of the assembly process. Therefore, this increases a man-hour, and besides, this technique cannot be employed for any harness other than the flat harness.

SUMMARY OF THE INVENTION

The present invention is to provide an electronic device which enables differentiation of a plurality of signal cables with a simple structure.

In an electronic device according to the present invention, a plurality of first terminals are connected to respective second terminals through respective flexible signal cables, the signal cables each includes a base end connected to each of the first terminals and a tip end connected to each of the second terminals.

The plurality of signal cables extend to corresponding second terminals through a deflection position distances to which from the first terminals are different, and the positions of the plurality of second terminals are shifted from each other in accordance with difference in lengths of the signal cables from the deflection position passing point to the tip ends.

In the electronic device according to the present invention described above, even in a case where the plurality of signal cables have the same lengths, since the plurality of signal cables extend from the first terminals to the second terminals through the deflection position, the plurality of signal cables have a difference in the lengths from the deflection position passing point to the tip ends.

The positions of the plurality of second terminals are shifted from each other in accordance with the difference in lengths of the signal cables from the deflection position passing point to the tip ends. Therefore, the tip ends of specific first terminals are connected to specific second terminals by repeating the work of connecting a tip end of a signal cable which has the shortest length between the deflection position passing point and the tip end thereof to a second terminal which is the nearest, and then, connecting a signal cable which has the second shortest length to a second terminal which is the second nearest, until a signal cable which has the longest length is connected.

Therefore, by correlating arrangement of the plurality of first terminals to arrangement of the plurality of second terminals preliminarily, it is possible to prevent the connection mistake between the terminals.

As described above, according to the electronic device according to the present invention, it is possible to differentiate the plurality of signal cables with a simple configuration that only changes paths of the plurality of signal cables.

DETAILED DESCRIPTION OF THE PREFERRED EMBODIMENT

Figure 5:
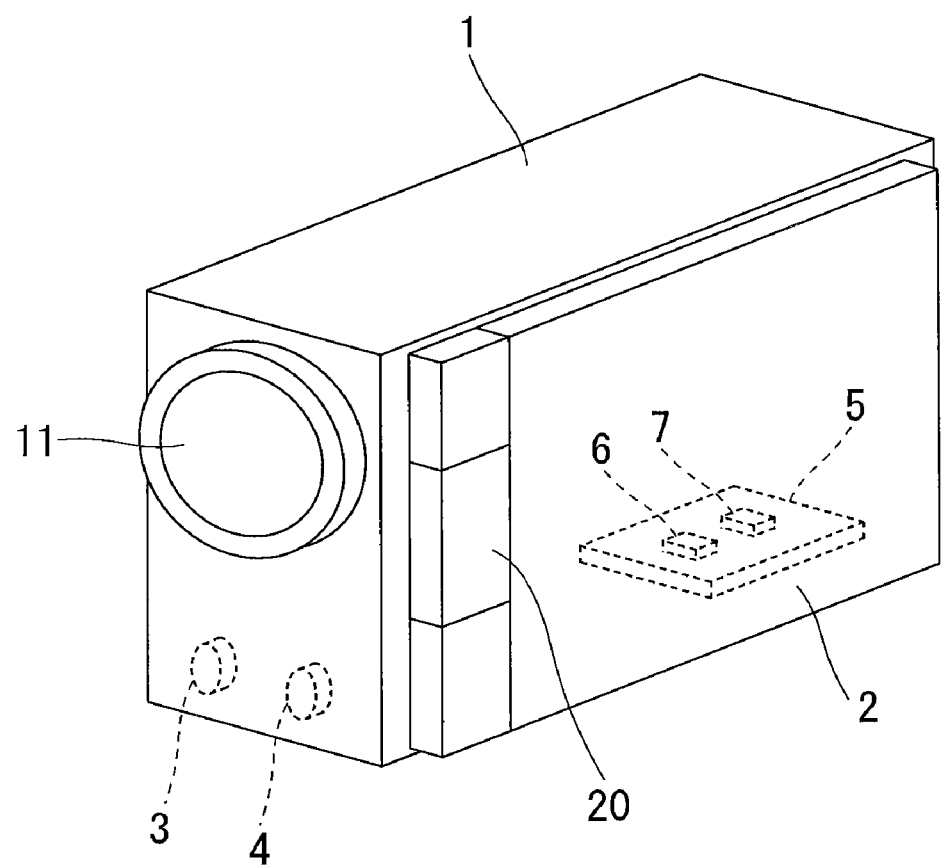
FIG. 5 is a perspective view showing one example of the electronic device in which the present invention should be implemented.

In a preferred embodiment discussed in detail below with reference to drawings, the present invention is implemented in a video camera shown in FIG. 5. In the video camera which is an embodiment of the present invention, as shown in FIG. 2, in a housing 1, arranged is a right and left pair of microphones 3, 4 which are connected to a right and left pair of terminal blocks 6, 7 on a circuit board 5, respectively, through two respective signal cables 32, 42, to thereby enable voice stereo recording.

Figure 1:
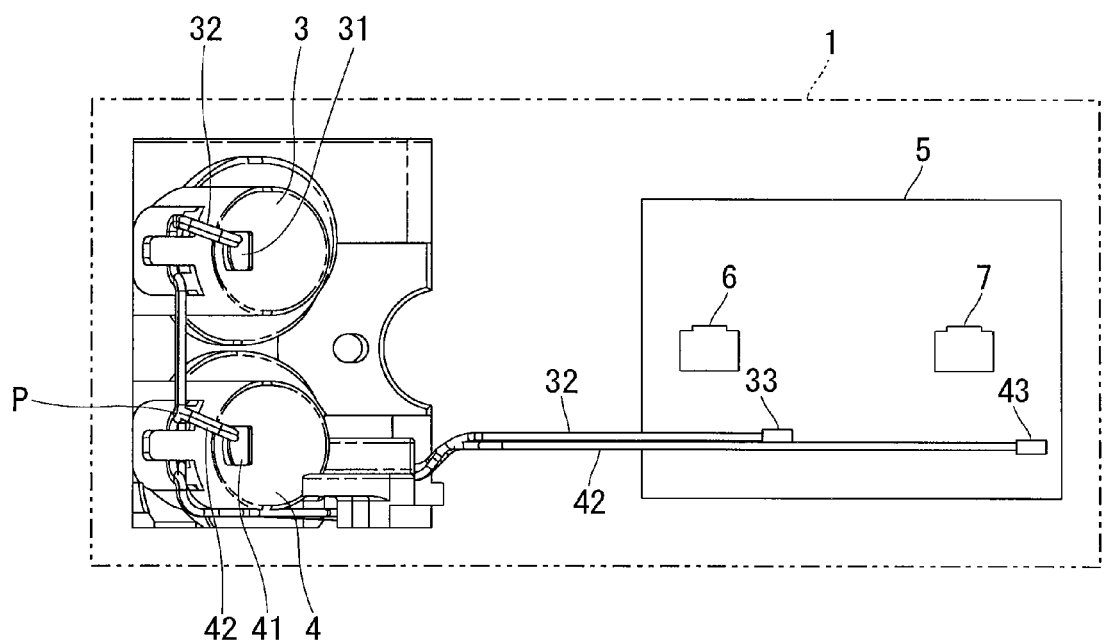
FIG. 1 is a plane view of an electronic device according to an embodiment of the present invention in a state where a connector is yet to be connected to a terminal block.

In particular, as shown in FIG. 1, a signal cable 32 is drawn out from a terminal 31 of the right channel microphone 3, and a signal cable 42 is drawn out from a terminal 41 of the left channel microphone 4. To tip end parts of the signal cables 32, 42, attached are respective connectors 33, 43 having a common specification and shape. The signal cables 32, 42 each comprises two lead wires which are bundled together, and the signal cables 32, 42 have the same lengths.

In contrast, on the circuit board 5 placed inside the housing 1, the right channel terminal block 6 is mounted at a position near both the microphones 3, 4, and the left channel terminal block 7 is mounted at a position far from both the microphones 3, 4.

Figure 2:
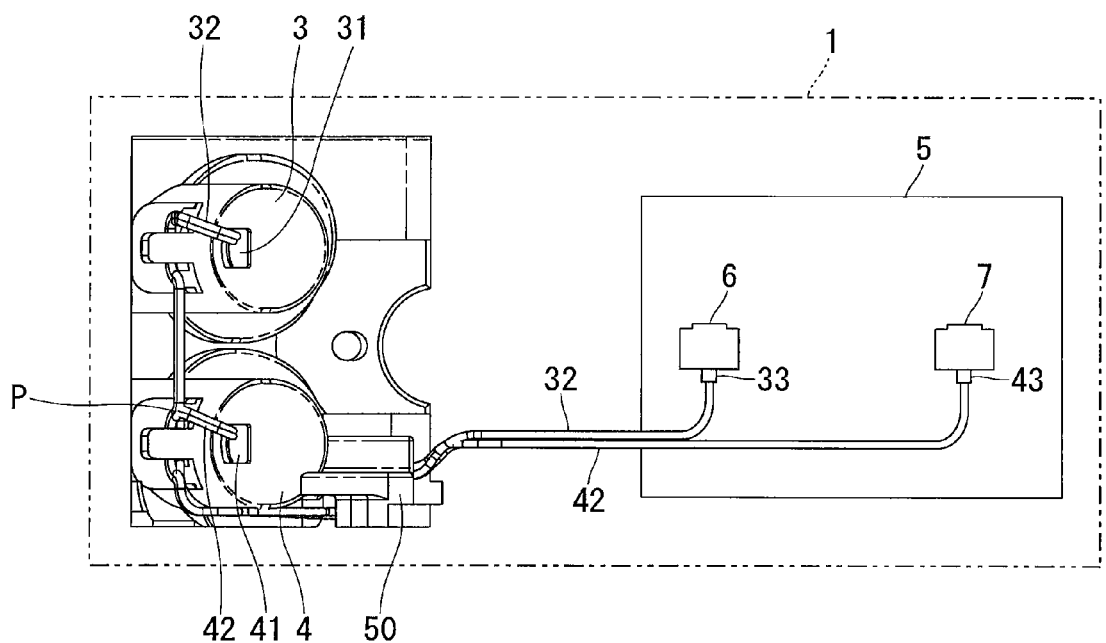
FIG. 2 is a plane view of the electronic device according to the embodiment of the present invention in a state where the connector is connected to the terminal block.
Figure 3:
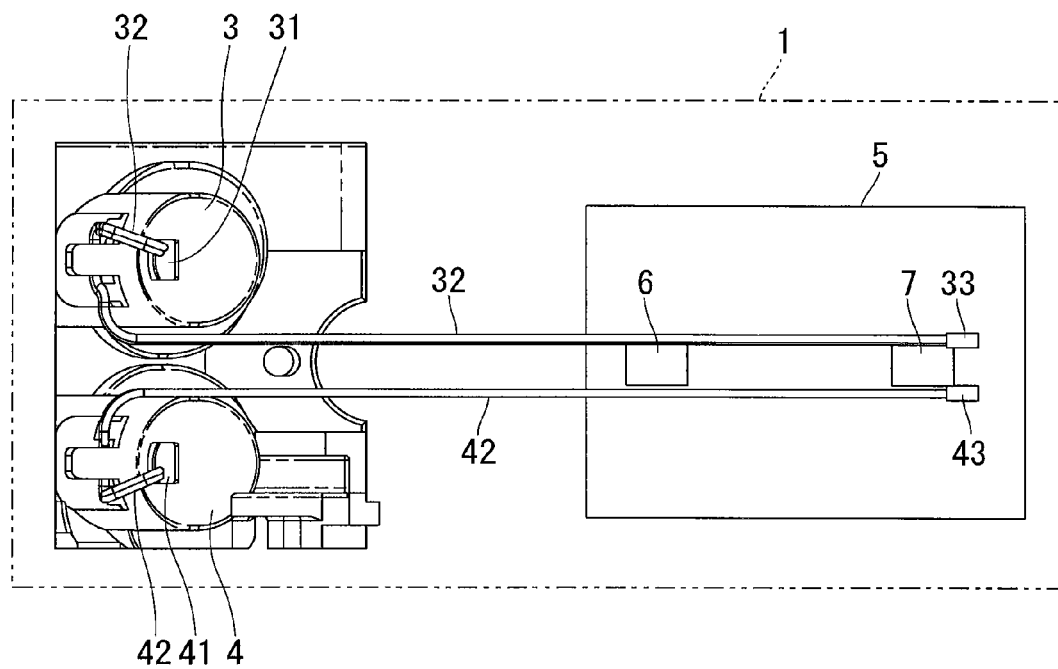
FIG. 3 is a plane view of a conventional electronic device in a state where a connector is yet to be connected to a terminal block.
Figure 4:
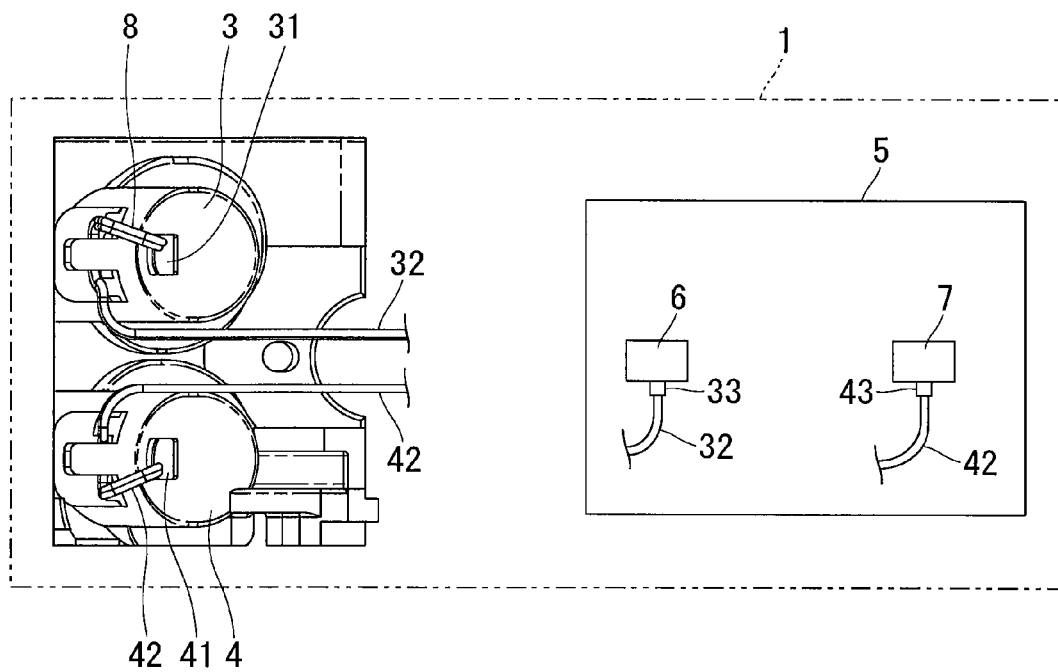
FIG. 4 is a partially broken plane view of the conventional electronic device in a state where the connector is connected to the terminal block.

As shown in FIG. 2, the signal cable 32 drawn out from the right channel microphone 3 passes outside the microphones 3, 4 and extends to the circuit board 5 side. The connector 33 at the tip end part of the signal cable 32 is coupled to the right channel terminal block 6 on the circuit board 5.

Also, the signal cable 42 drawn out from the left channel microphone 4 passes outside the microphones 3, 4 and extends to the circuit board 5 side. The connector 43 at the tip end part of the signal cable 42 is coupled to the left channel terminal block 7 on the circuit board 5.

Here, as shown in FIG. 2, the two signal cables 32, 42 are bundled together at a deflection position P distances to which from the terminal 31 of the right channel microphone 3 and from the terminal 41 of the left channel microphone 4 are different, and then from the deflection position P, the cables 32, 42 pass outside the left channel microphone 4 to pass through a latching piece 50, and extend to the channel terminal blocks 6, 7.

As a result, lengths of the signal cables from the deflection position P passing point to the connectors 33, 43 are different. In other words, the length of the signal cable drawn out from the right channel microphone 3 from the deflection position P to the connector 33 is shorter than the length of the signal cable 42 drawn out from the left channel microphone 4 from the deflection position P to the connector 43.

Therefore, in the assembly process of the camera described above, although the connector 33 of the signal cable 32 drawn out from the right channel microphone 3 can be coupled to the right channel terminal block 6, it cannot be coupled to the left channel terminal block 7.

In contrast, the connector 43 of the signal cable 42 drawn out from the left channel microphone 4 can be coupled to either of the right channel terminal block 6 and the left channel terminal block 7.

Therefore, in the assembly process of the above described camera, first, both the signal cables 32, 42 are bundled up at the deflection position P, and thereafter, the connector 33 of the signal cable 32 which has a shorter length to the tip end thereof is coupled to the right channel terminal block 6 which is located nearer, and then, the connector 43 of the signal cable 42 which has a longer length to the tip end thereof is coupled to the left channel terminal block 7 which is located farther.

It is thereby possible to connect the right channel microphone 3 to the right channel terminal block 6 via the signal cable 32, and connect the left channel microphone 4 to the left channel terminal block 7 via the signal cable 42.

In the assembly process of the above described camera, even when coupling of the connector 33 of the signal cable 32 which has a shorter length to the tip end thereof to the left channel terminal block 7 is tried first, the coupling is impossible because the signal cable 32 is not long enough. Therefore, surely prevented is a mistake of connecting the right channel microphone 3 to the left channel terminal block 7, and connecting the left channel microphone 4 to the right channel terminal block 6.

According to the camera described above, it is possible to differentiate the signal cables 32, 42 having the same lengths with the simple configuration that only changes paths of the signal cables 32, 42 without employing a configuration in which, for example, a flat harness is bent at a part thereof. Therefore, it is possible to execute the coupling operation of the connectors 33, 43 correctly.

The present invention is not limited to the foregoing embodiment in construction but can be modified variously within the technical range set forth in the appended claims. For example, the electronic component to be connected is not limited to the right and left pair of microphones, and it may be a group of electronic components each of which has the same function by itself but which exert different functions when connected to the terminal blocks, such as a right and left pair of speakers, a plurality of light receiving elements, a plurality of light emitting elements, and the like. Further, the present invention can be applied to connection between only terminals. Furthermore, the number of cables is not limited to two, but may be three or more. Also, the signal cable is not limited to the signal cable comprising two lead wires bundled together, but can be a signal cable comprising one lead wire or a signal cable comprising three or more lead wires bundled together.

What is claimed is:

1. An electronic device comprising a plurality of first terminals connected to respective second terminals through respective signal cables, the signal cables each including a base end connected to each of the first terminals and a tip end connected to each of the second terminals, the plurality of signal cables extending to corresponding second terminals through a deflection position distances to which from the first terminals are different, and the positions of the plurality of second terminals are shifted from each other in accordance with difference in lengths of the signal cables from the deflection position passing point to the tip ends, wherein the plurality of first terminals are arranged on a plurality of electronic components, the plurality of second terminals comprises a plurality of terminal blocks on a circuit board, the base end of each of the signal cables is connected to the first terminal of each of the electronic components, and a connector attached to the tip end of each of the signal cables is coupled to each of the terminal blocks, wherein all of the plurality of signal cables are bundled together at the deflection point.

2. An electronic device comprising a plurality of electronic components connected to respective terminal blocks through respective signal cables, wherein the signal cables each includes an end connected to a terminal of each of the electronic components, a connector attached to the other end of each of the signal cables is connected to each of the terminal blocks, all of the plurality of signal cables are bundled together at a deflection position distances to which from the terminals of the plurality of electronic components are different, the plurality of signal cables extend from the deflection position to corresponding terminal blocks, and the positions of the plurality of terminal blocks are shifted from each other in accordance with difference in lengths of the signal cables from the deflection position passing point to the connectors,
  wherein the plurality of terminal blocks are arranged on a circuit board.

3. The electronic device according to claim 2, wherein the plurality of signal cables have the same lengths, and the connectors attached to the other ends of the signal cables have a common specification and shape.

4. The electronic device according to claim 2, wherein the plurality of signal cables each comprises one or more lead wires which are bundled together.

5. The electronic device according to claim 2, wherein the plurality of electronic components each has the same function by itself, and they exert different functions when connected to corresponding terminal blocks.

6. The electronic device according to claim 5, wherein the plurality of electronic components are microphones, speakers, light emitting elements, or light receiving elements.

7. An electronic device comprising a plurality of electronic components connected to respective terminals through respective signal cables, the signal cables each including a base end connected to each of the electronic components and a tip end connected to each of the terminals, the plurality of signal cables extending to corresponding terminals through a deflection position distances to which from the base ends are different, and the positions of the plurality of terminals are shifted from each other in accordance with difference in lengths of the signal cables from the deflection position passing point to the tip ends,
  wherein the plurality of terminals are arranged on a circuit board, and
  wherein all of the plurality of signal cables are bundled together at the deflection point.

* * * * *